(12) United States Patent
Naganathan et al.

(10) Patent No.: US 7,509,556 B2
(45) Date of Patent: Mar. 24, 2009

(54) METHOD AND APPARATUS FOR COMBINING OUTPUT OF DIFFERENT TYPE INTERLEAVERS BASED ON AN INPUT DATA SEQUENCE TO OBTAIN A COMBINED OUTPUT

(75) Inventors: Purnima Naganathan, Longmont, CO (US); Thomas V. Souvignier, Longmont, CO (US)

(73) Assignee: Seagate Technology LLC, Scotts Valley, CA (US)

(*) Notice: Subject to any disclaimer, the term of this patent is extended or adjusted under 35 U.S.C. 154(b) by 736 days.

(21) Appl. No.: 10/718,208

(22) Filed: Nov. 20, 2003

(65) Prior Publication Data

US 2005/0149808 A1   Jul. 7, 2005

(51) Int. Cl.
*H03M 13/00* (2006.01)

(52) U.S. Cl. .................. 714/752; 714/702; 714/786

(58) Field of Classification Search ................ 714/702, 714/755, 784, 763, 752, 786
See application file for complete search history.

(56) References Cited

U.S. PATENT DOCUMENTS

| | | | |
|---|---|---|---|
| 6,334,197 B1 | 12/2001 | Eroz | |
| 6,353,900 B1 | 3/2002 | Sindhushayana | |
| 6,480,976 B1 | 11/2002 | Pan | |
| 6,513,139 B2 | 1/2003 | Gray | |
| 6,560,748 B2 * | 5/2003 | Li | 714/786 |
| 6,571,369 B1 * | 5/2003 | Li | 714/792 |
| 6,574,767 B2 | 6/2003 | Eroz | |
| 6,697,990 B2 * | 2/2004 | El-Gamal et al. | 714/755 |
| 7,158,589 B2 * | 1/2007 | Cameron et al. | 375/341 |
| 2002/0016944 A1 * | 2/2002 | Yoshida et al. | 714/758 |
| 2002/0108090 A1 * | 8/2002 | Ariel et al. | 714/792 |

FOREIGN PATENT DOCUMENTS

| | | |
|---|---|---|
| EP | 1022860 B1 | 7/2000 |
| WO | WO91/13437 | 9/1991 |
| WO | WO00/19618 | 4/2000 |
| WO | WO02/21702 A1 | 3/2002 |
| WO | WO02/078196 A1 | 10/2002 |

* cited by examiner

*Primary Examiner*—Esaw T Abraham
(74) *Attorney, Agent, or Firm*—David K. Lucente

(57) ABSTRACT

An apparatus, system and method in which a plurality of interleavers are utilized with the outputs of the interleavers being combined to generate a single combined output are provided. In a preferred embodiment, at least two of the plurality of interleavers are of a different type. For example, in one exemplary embodiment, a first interleaver is an S-random interleaver with a second interleaver being one of an algebraic, convolutional, helical, pseudo random, or other type of interleaver. Combinational logic receives the output from each of the plurality of interleavers and combines the outputs to generate one combined output having a permuted order. By combining the outputs from a plurality of interleavers, a greater amount of randomness in the input data may be obtained as opposed to that of the known single interleaver systems. In addition, by using a plurality of interleavers of different types, the limits of each individual type of interleaver may be relaxed in order to obtain a greater versatility of interleaver operation.

21 Claims, 4 Drawing Sheets

METHOD AND APPARATUS FOR COMBINING OUTPUT OF DIFFERENT TYPE INTERLEAVERS BASED ON AN INPUT DATA SEQUENCE TO OBTAIN A COMBINED OUTPUT

FIELD OF THE INVENTION

The present invention relates generally to interleavers and the user of interleavers to provide a randomized set of data. More particularly, the present invention relates to a method and apparatus for using a plurality of interleavers and combining their outputs to obtain a single combined output data set.

BACKGROUND OF THE INVENTION

Interleavers are used in many digital transmission devices, e.g., wireless communication devices, storage media drives, and the like, for spreading out errors in time so that errors within a codeword appear to be independent. In addition, interleavers are often used as "random" address generators. Interleaving is a process of reordering a sequence of symbols or bits in a predetermined manner. The "interleaver size" is equal to the size of the sequence. The apparatus performing the interleaving is referred to herein as the interleaver.

Many different types of interleavers are known in the art including S-random interleavers, algebraic interleavers, convolutional interleavers, helical interleavers, pseudo random interleavers, block interleavers, matched interleavers and the like. Each of these interleavers has its own strengths and weaknesses that cause them to be well suited for some applications and to not be the optimum solution for other applications. These weaknesses typically come in the form of constraints on the interleaver size and constraints on the amount of randomization that may be achieved by the interleaver.

For example, S-random Interleavers are one of the most widespread forms of interleavers. The principle behind S-random interleavers is to avoid mapping neighbor positions of an original input sequence to another neighbor position of the interleaved sequence within a window of size S. The design goal in S-random interleavers is to maximize S while preserving the above principle. However, S-random interleavers have to be re-designed every time the interleaver size is changed and there is typically no requirement of any resemblance between the interleavers with similar sizes.

Thus, it would be beneficial to have an apparatus and method for combining interleavers of different types so that the various strengths of these interleavers may be maximized while minimizing the weaknesses of the interleavers to thereby achieve an optimum combined output from the plurality of interleavers.

SUMMARY OF THE INVENTION

The present invention provides a system and method in which a plurality of interleavers are utilized with the outputs of the interleavers being combined to generate a single combined output. In a preferred embodiment, at least two of the plurality of interleavers are of a different type. For example, in one exemplary embodiment, a first interleaver is an S-random interleaver with a second interleaver being one of an algebraic, convolutional, helical, pseudo random, or other type of interleaver.

Combinational logic receives the output from each of the plurality of interleavers and combines the outputs to generate one combined output having a permuted order.

By combining the outputs from a plurality of interleavers, a greater amount of randomness in the input data may be obtained as opposed to that of the known single interleaver systems. In addition, by using a plurality of interleavers of different types, the limits of each individual type of interleaver may be relaxed in order to obtain a greater versatility of interleaver operation.

The present invention also can be implemented as a computer-readable program storage device which tangibly embodies a program of instructions executable by a computer system to perform a method for interleaving a sequence of data. In addition, the invention also can be implemented as an interleaving apparatus itself.

These and various other features as well as advantages which characterize the present invention will be apparent upon reading of the following detailed description and review of the associated drawings.

DETAILED DESCRIPTION

Figure 1:
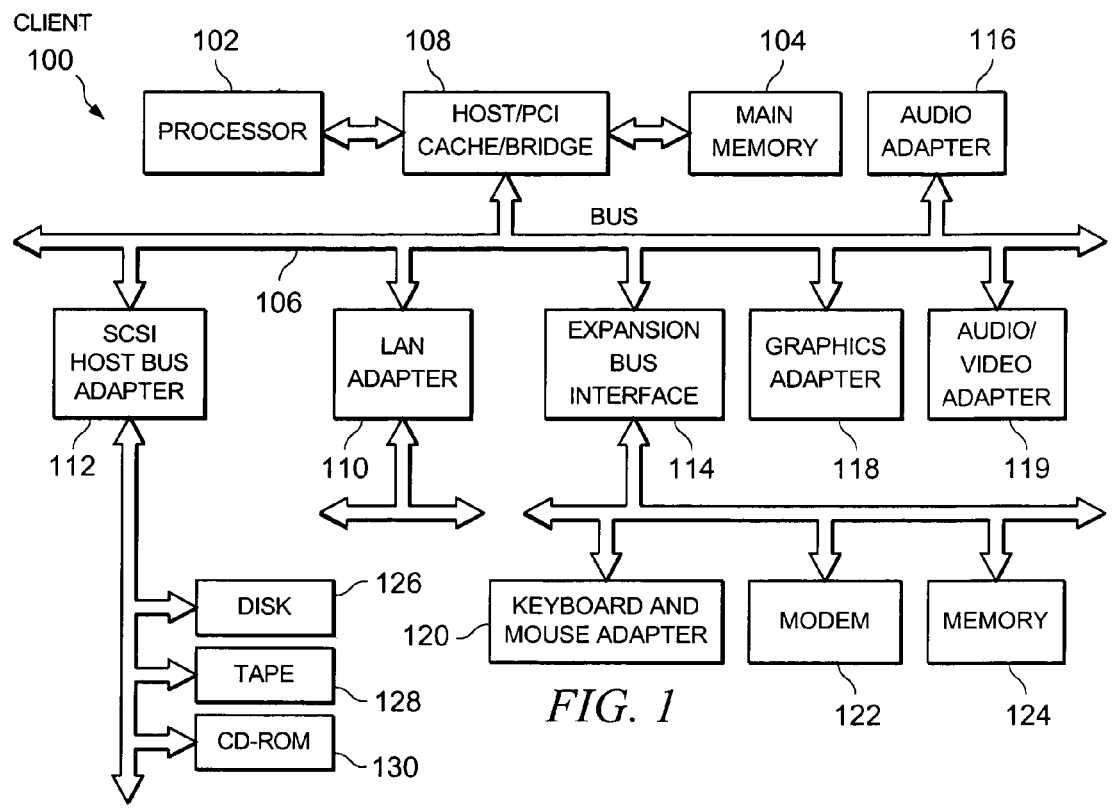
FIG. 1 is an exemplary block diagram of a data processing device in which the present invention may be implemented.
Figure 2:
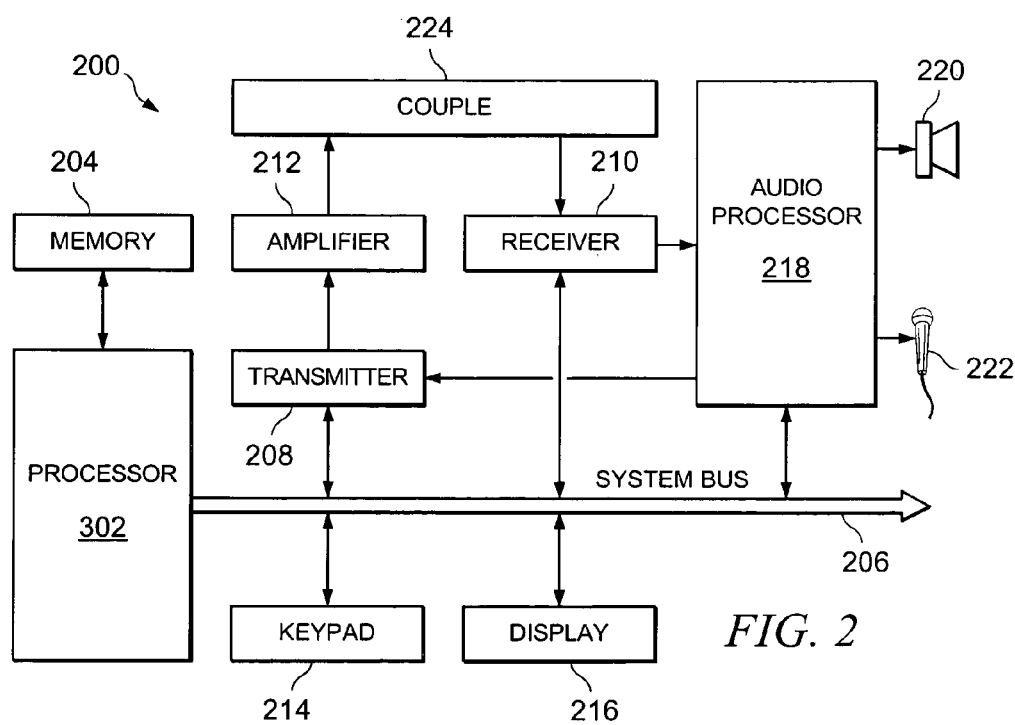
FIG. 2 is an exemplary block diagram of a wireless communication device in which the present invention may be implemented.

The various embodiments of the present invention may be implemented in any data processing device in which interleaving of an input data sequence is desirable. For example, the embodiments of the present invention may be implemented in wireless communication devices, data storage systems, and the like. FIG. 1 and FIG. 2 are intended to provide only an exemplary block diagram of one such data processing system in which the present invention may be implemented. It will be appreciated that many modifications of the data processing system depicted in FIG. 1 and FIG. 2 may be made without departing from the spirit and scope of the present invention.

With reference now to FIG. 1, a block diagram of a data processing system is shown in which the present invention may be implemented. Data processing system 100 is an example of a computer in which code or instructions implementing the processes of the present invention may be located or apparatus according to embodiments of the present invention may be located. Data processing system 100 employs a peripheral component interconnect (PCI) local bus architecture. Although the depicted example employs a PCI bus, other bus architectures such as Accelerated Graphics Port (AGP) and Industry Standard Architecture (ISA) may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, small computer system interface SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. SCSI host bus adapter 112 provides a connection for hard disk drive 126, tape drive 128, and CD-ROM drive 130. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system such as Windows XP, which is available from Microsoft Corporation. An object oriented programming system such as Java may run in conjunction with the operating system and provides calls to the operating system from Java programs or applications executing on data processing system 100. "Java" is a trademark of Sun Microsystems, Inc. Instructions for the operating system, the object-oriented programming system, and applications or programs are located on storage devices, such as hard disk drive 126, and may be loaded into main memory 104 for execution by processor 102.

As mentioned above, those of ordinary skill in the art will appreciate that the hardware in FIG. 1 may vary depending on the implementation. Other internal hardware or peripheral devices, such as flash read-only memory (ROM), equivalent nonvolatile memory, or optical disk drives and the like, may be used in addition to or in place of the hardware depicted in FIG. 1. Also, the processes of the present invention may be applied to a multiprocessor data processing system.

For example, data processing system 100, if optionally configured as a network computer, may not include SCSI host bus adapter 112, hard disk drive 126, tape drive 128, and CD-ROM 130. In that case, the computer, to be properly called a client computer, includes some type of network communication interface, such as LAN adapter 110, modem 122, or the like. As another example, data processing system 100 may be a stand-alone system configured to be bootable without relying on some type of network communication interface, whether or not data processing system 100 comprises some type of network communication interface. As a further example, data processing system 100 may be a personal digital assistant (PDA), which is configured with ROM and/or flash ROM to provide non-volatile memory for storing operating system files and/or user-generated data.

The depicted example in FIG. 1 and above-described examples are not meant to imply architectural limitations. For example, data processing system 100 also may be a notebook computer or hand held computer in addition to taking the form of a PDA. Data processing system 100 also may be a kiosk or a Web appliance.

FIG. 2 is an exemplary block diagram of a wireless communication device in which the present invention may be implemented. Wireless communication device 200 includes a processor 202 for controlling operation of the communication device and a memory 204. The processor 202 may be a general-purpose microprocessor operating under the control of instructions stored a memory, such as memory 204, or device-specific circuitry for controlling the operation of the telephone device. Processor 202 is connected by system bus 206 to transmitter 208, receiver 210, keypad 214, display 216, and audio processor 218. Keypad 214 may be a keypad and/or buttons. Display 216 may be any type of display device including a liquid crystal display (LCD) or other known displays, such as a cathode ray tube or active matrix display.

Transmitter 208 and receiver 210 are coupled to a telephone signal by couple 224 to provide full duplex communication. The telephone signal may be provided by a telephone line (not shown) in a land-based telephone or an antenna, such as for a wireless telephone. Audio processing circuit 218 provides basic analog audio outputs to speaker 220 and accepts analog audio inputs from microphone 222. Received signals are demodulated and decoded by receiver 210. Transmitter 208 encodes and modulates signals passed to it by processor 202 or audio processor 218. The output of the transmitter is amplified by power amplifier 212 to control the power level at which the signal is transmitted.

Processor 202 or audio processor 218 may detect audible call status information and call status codes received by receiver 210. Memory 204 may include a lookup table associating call status information or call status codes with visual call status information, such as text messages. Processor 202 detects or receives a call status code and displays an appropriate call status message on display 216. Those of ordinary skill in the art will appreciate that the hardware depicted in FIG. 2 may vary.

As mentioned above, the present invention provides a method and apparatus in which a plurality of interleavers are utilized with their outputs being combined to generate a permuted output data sequence. Thus, a brief description of a known architecture for utilizing interleavers will first be provided in order to amplify the differences between known techniques and the preferred embodiments of the present invention.

Figure 3:
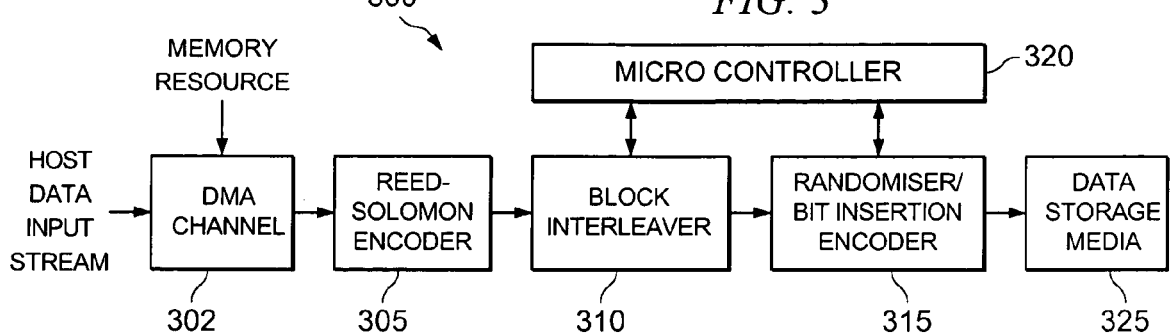
FIG. 3 is a block diagram of encoding path of a data processing device for storing data to a data storage media.

FIG. 3 is a highly simplified schematic block diagram that illustrates an exemplary data encoder system for use in encoding a data input stream for storage on a data storage media. It will be appreciated that the present invention finds application in many different data storage environments as well as other applications in which data is transmitted from a source device to a receiving device. For purposes of the description of the present invention, it will be assumed that the application of the present invention is to storage of data on a storage media, although it should be appreciated that the present invention is not limited to such an application.

As depicted in FIG. 3, the system 300 includes a Reed-Solomon encoder 305, which receives the data input stream from a direct memory access (DMA) channel 302, which manages the flow of data in and out of shared memory resources. Reed-Solomon encoding is well known in the art, and will not be described in detail herein. Furthermore, it will be appreciated by those of ordinary skill in the art that the data input stream need not be encoded by a Reed-Solomon encoder. In practice, other forms of error encoding, such as trellis encoding, convolutional encoding, etc., may be used in the system of FIG. 3 as called for by the specific application.

Once the data has been Reed-Solomon encoded within the Reed-Solomon encoder 305, the data is block interleaved within a block interleaver 310. As is well known in the art, a block interleaver typically comprises a matrix wherein the data stream is fed in by rows and read out by columns. By block interleaving the encoded data, errors which occur during a deep fade (i.e., when a long succession of data is lost due to Raleigh fading effects) are distributed in smaller chunks throughout a larger portion of the data input stream so that within any given region, errors in the data are more likely to be recoverable.

Once the data has been block interleaved, the data is input to a randomizer/bit-insertion encoder 315. The custom randomizer/bit- insertion encoder 315 randomizes the incoming data stream with a configurable pseudo-random code, and thereafter inserts data bit patterns as necessary in order to make the randomized data stream robust against well-known detection errors such as the loss of phase lock or calibration on the automatic gain control (AGC) circuit on the decoding side.

Once the data has been randomized and bit insertion has taken place at the appropriate "trouble spots," the data is stored onto a data storage media 325 which, for example, may comprise a magnetic disk, a magnetic storage tape, or the like. The block interleaver 310 and the randomizer/bit-insertion encoder 315 both operate under the control of a microcontroller 320.

Figure 4:
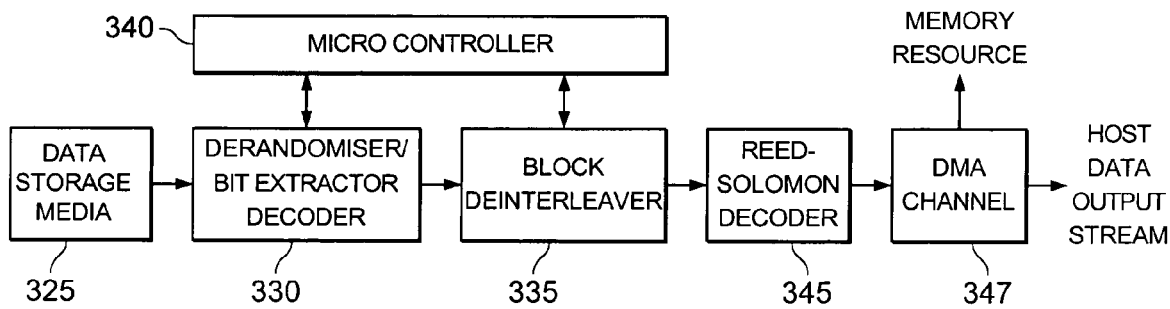
FIG. 4 is a block diagram of a decoding path of a data processing device for retrieving data from a data storage media.

FIG. 4 is a highly simplified block diagram which shows an exemplary system used to decode data stored on the data storage media 325 when the data has been encoded by the system and method described with reference to FIG. 3. As shown in FIG. 4, data read from the data storage media 325 is fed into a derandomizer/bit-extractor decoder 330. The derandomizer/bit-extractor decoder 330 acts to essentially reverse the randomization and bit-insertion process performed within the randomizer/bit-insertion encoder 315. That is, the decoder 330 detects, extracts and discards the data bit patterns that were inserted within the encoder 315, and thereafter derandomizes the data to obtain the original data stream that was input to the randomizer/bit-insertion encoder 315.

Thereafter, the output of the derandomizer/bit-extractor decoder 330 is provided to a block deinterleaver 335, which reorders the interleaved blocks into their original order, as is well understood in the art. After the data has been deinterleaved within the block deinterleaver 335, this data is fed into a Reed-Solomon decoder 345. The Reed-Solomon decoder 345 acts to detect and correct errors within the output data stream. Once the data has been Reed-Solomon decoded, the output data stream from the Reed-Solomon decoder 345 is a reconstruction of the data stream that was originally input to the Reed-Solomon encoder 305 for storage on the data storage media 325. A DMA channel 347 directs the flow of data to the appropriate memory resource. The derandomizer/bit-extractor decoder 330, the block deinterleaver 335, and the Reed-Solomon decoder 345 are all under the control of a microcontroller 340, which may, in one embodiment, be implemented in a processor of the data processing device.

The microcontrollers 320, 340 enable/disable the encoder 315 and the decoder 330. Furthermore, the microcontroller 340 monitor error status from the decoder 330 (e.g., CRC errors, insert extraction errors, etc.). The microcontroller 320 further provides the correct randomizer seed for the encoder 315 and the decoder 330 and may optionally also monitor the encoder 315 for excessive insertions. In addition, the microcontroller creates header bytes for each block indicating address information for the Reed-Solomon decoder and the randomizer seed required for decoding. The microcontroller further invokes rewrites when a read-after-write error is detected. Finally, the microcontroller invokes a read retry when the capability of the Reed-Solomon encoder/decoder is exceeded as is well understood in the art.

As shown above, the encoding and decoding paths of known data storage systems make use of interleavers to spread out errors in the data sequence so that they may be more easily handled by error correction circuitry. Essentially, an interleaver randomizes the data sequence based on a programmed methodology. The methodology may take many different forms such as a random resequencing of the data sequence, algebraic resequencing, helical resequencing, and the like.

Figure 5:
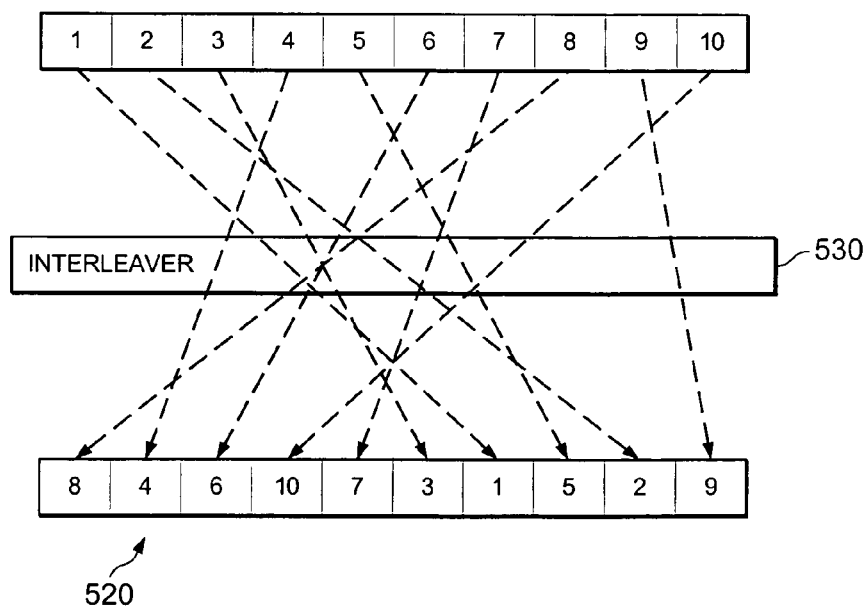
FIG. 5 is a general diagram illustrating the methodology behind interleavers.

FIG. 5 is a general diagram illustrating an exemplary methodology of interleaver. As shown in FIG. 5, the interleaver takes an input data sequence 510 and outputs an output data sequence 520 that is a reordered or resequenced version of the input data sequence 510. The manner by which the reordering or resequencing is performed is application specific. In the depicted interleaver 530, for example, data address 1 is repositioned to be in the place of data address 7; data address 7 is reordered to be in the place of data address 5, and so on. The particular manner by which the data sequence is reordered, e.g., the seed value to the algorithm, or the like, is stored for later use by the deinterleaver to return the output data sequence 520 to ordering of the input data sequence 510.

As illustrated above, the systems make use of a single interleaver to perform the interleaving of a data sequence received from a decoder. Thus, the reordering of the data sequence is limited by the limitations of the particular interleaver that is chosen. For example, the amount of randomization and the size of the data sequence are all limited by the capabilities of the single interleaver. The present invention aims to improve upon this known technology by providing a mechanism in which a plurality of interleavers are provided in parallel and may be utilized to generate a combined permuted single output based on the individual outputs of the plurality of interleavers.

Figure 6:
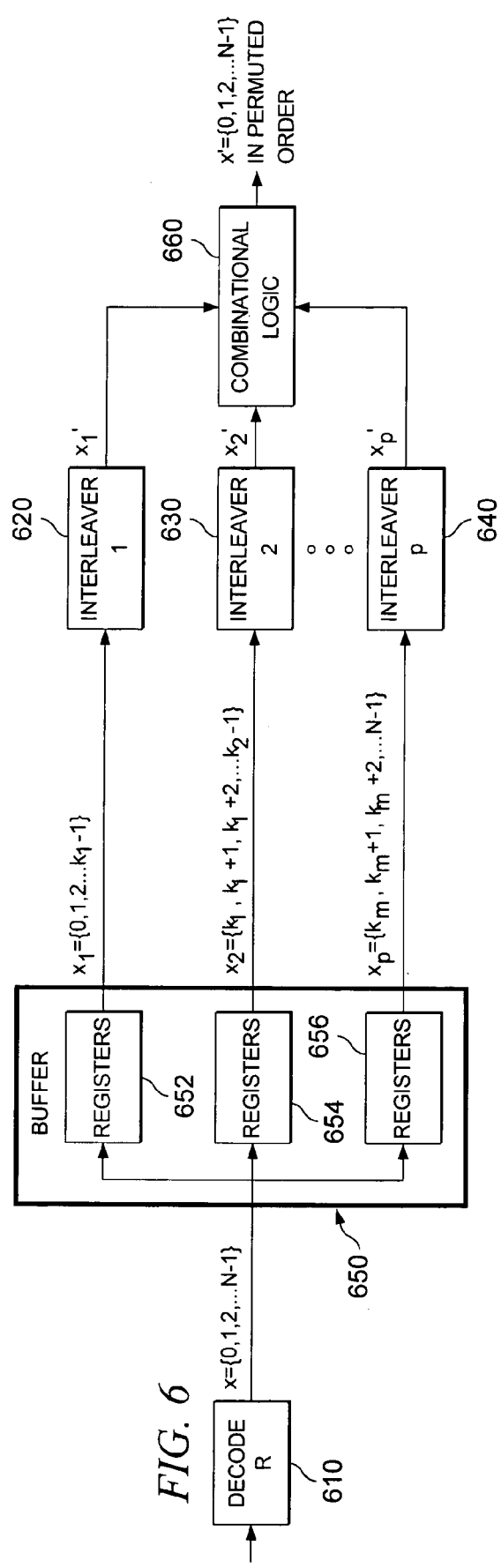
FIG. 6 is an exemplary block diagram illustrating an interleaver architecture in accordance with an exemplary embodiment of the present invention.

FIG. 6 is an exemplary block diagram illustrating an interleaver architecture in accordance with an exemplary embodiment of the present invention. As shown in FIG. 6, a decoder 610 provides a data sequence, such as a sequence of data addresses, as an output to interleavers 620-640. Buffer 650 stores the data sequence in registers 652-656. For example, data addresses 0 to k1-1 are stored in register 652, data addresses $k_1$ to $k_2$-1 are stored in register 654, and data addresses km to N-1 are stored in register 656, where N is the total number of addresses in the data sequence.

Each interleaver 620-640 reads data from a respective one of the registers 652-656. Thus, interleaver 620 performs interleaving functions on the data stored in register 652, interleaver 630 performs interleaving functions on the data stored in register 654, and interleaver 640 performs interleaving functions on the data stored in register 656. In a preferred embodiment, at least two of these interleavers 620-640 are of a different type. That is, for example, interleaver 620 may be a S-random interleaver and interleaver 630 may be an algebraic interleaver. The remaining interleaver(s) 640 may be of the same or different types to those of interleavers 620-630.

The interleavers 620-640 generate randomized versions of their respective input data sequences read from registers 652-656. These randomized versions are denoted $x_1'$, $x_2'$, and $x_3'$. These-output data sequences are provided to combinational logic 660. The combinational logic 660 combines the three outputs to generate a single permuted output x'. The manner by which the randomized versions of the input data sequences are combined depends on the particular application and may take a number of different forms. In some preferred embodiments, the combinational logic 660 includes a multiplexer that multiplexes the three data sequences $x_1'$, $x_2'$, and $x_3'$ to generate the output data sequence x'. In other preferred embodiments, the combinational logic appends one data sequence $x_3'$ to the next $x_2'$ and so on. In still other embodiments, the combinational logic 660 may include an interleaver that operates on the plurality of outputs from the interleavers 620-640 to interleave the outputs to generate a further randomized output x'. Other methods of combining the outputs from the interleavers may be used without departing from the spirit and scope of the present invention.

The architecture shown in FIG. 6 may be considered a single stage of a much larger architecture. For example, multiple copies of the stage depicted in FIG. 6 may be used in series or in parallel to achieve even greater amounts of randomness and variability in size.

Figure 7:
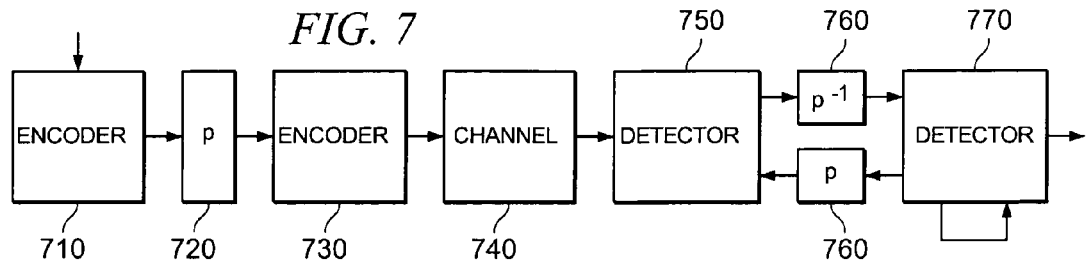
FIG. 7 is an exemplary diagram of an architecture in which a stage such as that shown in FIG. 6 may be utilized.

FIG. 7 is an exemplary diagram illustrating one exemplary architecture in which the stage shown in FIG. 6 is implemented. As shown in FIG. 7, data is first received by an encoder 710 which encodes the data and passes the encoded data to a first interleaver 720. The interleaver 720 may be, for example, an interleaver according to the present invention in which a plurality of interleavers of different types operate in parallel on the received data and whose outputs are combined into a single output. This output is then provided to encoder 730 which then transmits the encoded data output from the interleaver 720 over channel 740.

The data is then detected by detector 750 where the encoded data is provided to the de-interleaver 760. The de-interleaver 760 returns the encoded data to its original state prior to the operation of the interleaver 720 and then passes this data to detector 770.

Figure 8:
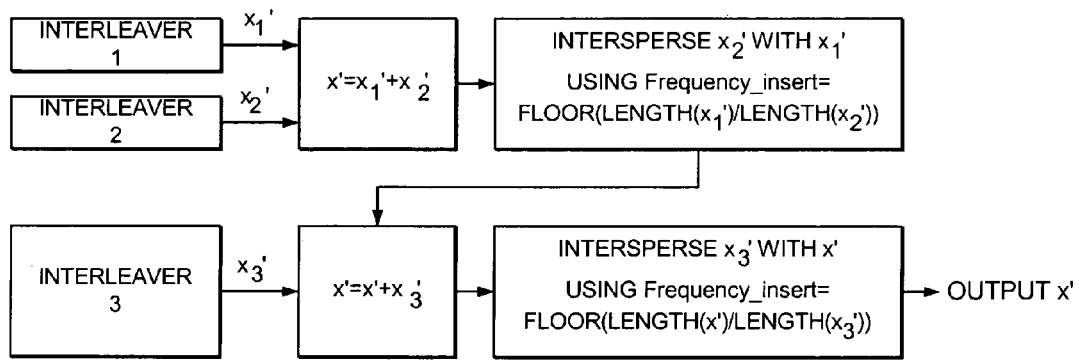
FIG. 8 is an exemplary diagram illustrating a manner by which the output from a plurality of interleavers may be combined to generate a single permuted output.

FIG. 8 is an exemplary diagram illustrating a manner by which the output from a plurality of interleavers may be combined to generate a single permuted output. As shown in FIG. 8, an exemplary embodiment of the present invention combines the output from the interleavers by appending the output of one interleaver to the output of another interleaver. That is, $x'=x_1'+x_2'$, where "+" denotes appending. With such an approach, the higher numbered bit positions will tend to remain at the higher end of x'. However, the desire is to spread the bits as much as possible from their original positions.

In order to disperse the bits as much as possible, elements of $x_1'$ and $x_2'$ are interspersed such that the bits from $x_2'$ will be more dispersed. This may be achieved in many different ways. One preferred method for interspersing the bits of $x_1'$ and $x_2'$ is to choose a frequency of insertion by finding a ratio of the lengths of $x_1'$ and $x_2'$. This value is termed the "frequency_insert" and is chosen as Frequency_insert=floor(length($x_1'$)/length($x_2'$))

For every frequency_insert bits in $x_1'$, a bit from $x_2'$ is inserted while retaining the bits from $x_1'$. The final interleaver vector is now a combination of the outputs from the two interleaves. This process may be repeated for each additional interleaver utilized such that the result of the appending and interspersing of $x_1'$ and $x_2'$ is used as a basis for appending and interspersing the bits from $x_3'$.

Figure 9:
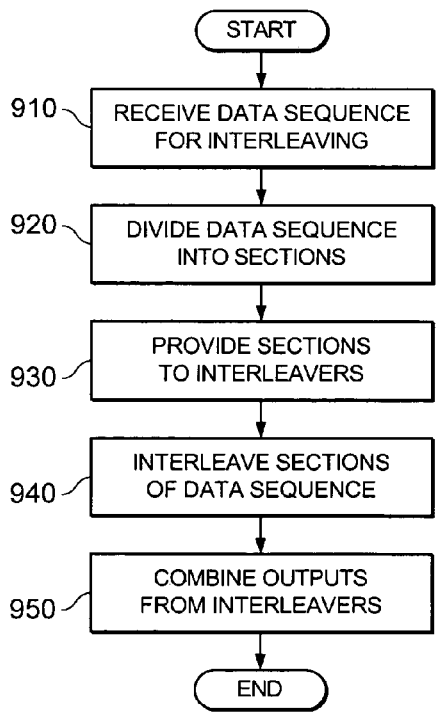
FIG. 9 is a flowchart outlining an exemplary operation of one exemplary embodiment of the present invention.

FIG. 9 is a flowchart outlining an exemplary operation of one exemplary embodiment of the present invention. It will be understood that each block of the flowchart illustration, and combinations of blocks in the flowchart illustrations, can be implemented by computer program instructions. These computer program instructions may be provided to a processor or other programmable data processing apparatus to produce a machine, such that the instructions, which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 9, the operation starts by receiving a data sequence for interleaving (step 910). The data sequence is then divided into sections (step 920). Each section of the data sequence is provided to a different interleaver (step 930). The interleavers perform interleaving functions, appropriate to the particular interleaver type, on the section of the data sequence input to them (step 940). The outputs from the interleavers are then provided to combinational logic where the outputs are combined into a single output data sequence (step 950). The operation then terminates.

Figure 10:
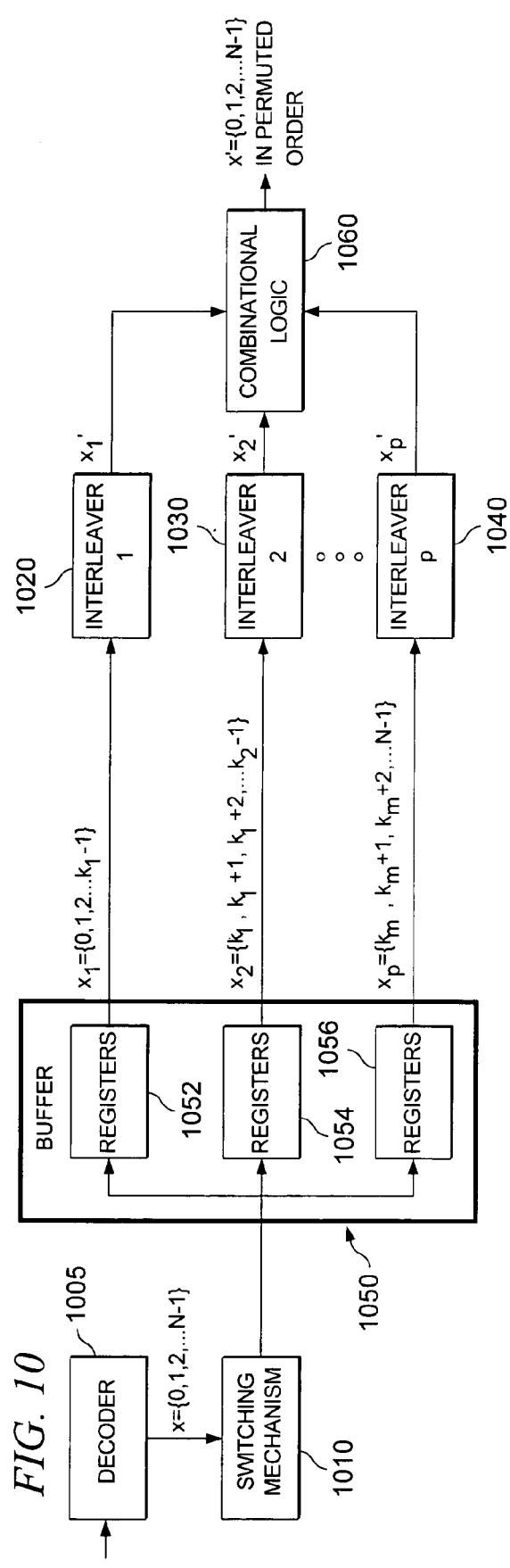
FIG. 10 is an exemplary diagram of an alternative embodiment of the present invention in which the particular interleavers utilized may be selected using a switching mechanism.

FIG. 10 is an exemplary diagram of an alternative embodiment of the present invention. The previous embodiments are described in terms of the input data sequence being separated into sections for each of the interleavers provided in the particular apparatus. In an alternative approach, particular ones of the interleavers in the apparatus may be selected for use with a particular data sequence. That is, switching logic 1010 may be provided for switching between different combinations of interleavers that are used to perform the interleaving of the input data sequence.

The switching may be performed based on header information received with the data sequence, a stored mapping table for mapping types of data sequences or sources of data sequences to a particular combination of interleavers, or the like. Based on this information, the switching logic 1010 may "turn on" or "turn off" certain ones of the interleavers 1020-1040. Depending on which interleavers are "turned on", i.e. are enabled to receive portions of the input data sequence, the input data sequence is divided into sections with the sections being stored in respective ones of registers 1052-1056. Thus, with this alternative embodiment, the particular types of interleavers that are to be utilized in processing the input data sequence may be dynamically selected.

Although not explicitly illustrated, in a further alternative embodiment, in addition to, or alternative to the embodiments described above, different combinational logic 1060 may be provided with a switching mechanism being used to switch between the different combinational logic 1060 being used to combine the outputs from the interleavers 1020-1040. The switching may be performed in a similar manner to that described above with regard to the switching between different combinations of interleavers. Thus, with these alternative embodiments, various amounts of randomness and size may be achievable through the selection of the interleavers and combinational logic utilized in processing the input data sequence.

Thus, the present invention provides a mechanism for combining the outputs from a plurality of interleavers operating in parallel on portions of an input data sequence to achieve a single permuted data sequence. In this way, interleavers of different types may be combined to achieve an output that is not restricted by the limitations of a single interleaver alone.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of generating a permuted data sequence based on an input data sequence, comprising:
   receiving the input data sequence;
   partitioning the input data sequence into a plurality of sections;
   providing each section of the plurality of sections to a different interleaver of a plurality of interleavers, wherein at least two of the plurality of interleavers are of a different type and wherein each interleaver of the plurality of interleavers generates an output based on the section provided to the interleaver; and
   combining the outputs from the plurality of interleavers to generate the permuted data sequence.

2. The method of claim 1, wherein the plurality of interleavers includes at least two of the following:
   an S-random interleaver, an algebraic interleaver, a convolutional interleaver, a helical interleaver, a pseudo random interleaver, a block interleaver, and a matched interleaver.

3. The method of claim 1, wherein combining the outputs from the plurality of interleavers includes:
   providing the outputs from the plurality of interleavers to combinational logic that combines the outputs in a specific manner to generate the permuted data sequence.

4. The method of claim 3, wherein the specific manner includes appending the output from a first interleaver of the plurality of interleavers to the end of the output from a second interleaver of the plurality of interleavers.

5. The method of claim 3, wherein the specific manner includes using a combinational interleaver to interleave the output from a first interleaver of the plurality of interleavers with the output from a second interleaver of the plurality of interleavers.

6. The method of claim 3, wherein the specific manner includes interspersing bits of an output from a first interleaver of the plurality of interleavers with bits of the output from a second interleaver of the plurality of interleavers.

7. The method of claim 6, wherein the bits of the outputs from the first interleaver and the second interleaver are interspersed using a frequency of insertion calculated based on the following equation:

$$\text{Frequency\_insert} = \text{floor}(\text{length}(x_1')/\text{length}(x_2'))$$

Where $x_1'$ is the output from the first interleaver and $x_2'$ is the output from the second interleaver.

8. The method of claim 1, wherein the method is implemented in hardware of one of a wireless telephone and a portable computing device.

9. The method of claim 1, further comprising:
   selecting the plurality of interleavers from a pool of interleavers based on a selection criteria.

10. An apparatus for generating a permuted data sequence based on an input data sequence, comprising:
    a buffer;
    a pool of interleavers coupled to the buffer; and
    combinational logic coupled to the pool of interleavers, wherein the buffer receives the input data sequence, partitions the input data sequence into a plurality of sections, and provides each section of the plurality of sections to a different interleaver of a plurality of interleavers, wherein at least two of the plurality of interleavers are of a different type, wherein each interleaver of the plurality of interleavers generates an output based on the section provided to the interleaver, and wherein the outputs from the plurality of interleavers are combined by the combinational logic to generate the permuted data sequence.

11. The apparatus of claim 10, wherein the plurality of interleavers includes at least two of the following:
    an S-random interleaver, an algebraic interleaver, a convolutional interleaver, a helical interleaver, a pseudo random interleaver, a block interleaver, and a matched interleaver.

12. The apparatus of claim 10, wherein the combinational logic combines the outputs by appending the output from a first interleaver of the plurality of interleavers to the end of the output from a second interleaver of the plurality of interleavers.

13. The apparatus of claim 10, wherein the combinational logic combines the outputs by using a combinational interleaver to interleave the output from a first interleaver of the plurality of interleavers with the output from a second interleaver of the plurality of interleavers.

14. The apparatus of claim 10, wherein the combinational logic combines the outputs by interspersing bits of an output from a first interleaver of the plurality of interleavers with bits of the output from a second interleaver of the plurality of interleavers.

15. The apparatus of claim 14, wherein the bits of the outputs from the first interleaver and the second interleaver are interspersed using a frequency of insertion calculated based on the following equation:

$$\text{Frequency\_insert} = \text{floor}(\text{length}(x_1')/\text{length}(x_2'))$$

wherein $x_1'$ is the output from the first interleaver and $x_2'$ is the output from the second interleaver.

16. The apparatus of claim 10, wherein the apparatus is part of one of a wireless telephone and a portable computing device.

17. The apparatus of claim 10, further comprising: a switching mechanism for selecting the plurality of interleavers from the pool of interleavers based on a selection criteria.

18. A method of generating a permuted data sequence based on an input data sequence, comprising:
    receiving the input data sequence;
    determining a subset of interleavers, from a plurality of interleavers, to be used in generating the permuted data sequence;
    providing the input data sequence to the subset of interleavers, wherein the interleavers produce modified output data sequences based on the input data sequence; and
    combining the modified output data sequences to generate the permuted data sequence.

19. The method of claim 18, wherein determining the subset of interleavers includes determining the subset of interleavers based on header information received with the data sequence.

20. The method of claim 18, wherein determining the subset of interleavers includes determining the subset of interleavers based on a mapping table that maps types of data sequences or sources of data sequences to a subset of interleavers.

21. The method of claim 18, wherein the subset of interleavers includes at least two interleavers that are of a different type from one another.

* * * * *